US012126069B2

United States Patent
Buckley et al.

(10) Patent No.: US 12,126,069 B2
(45) Date of Patent: *Oct. 22, 2024

(54) CAVITY RESONANCE SUPPRESSION USING DISCRETE THERMAL PEDESTALS IN ACTIVE ELECTRONICALLY SCANNED ARRAY

(71) Applicant: Hughes Network Systems, LLC, Germantown, MD (US)

(72) Inventors: Michael Buckley, Boyds, MD (US); Tom Walter, Germantown, MD (US); Bingqian Lu, Olney, MD (US); Lal Mohan Bhowmik, Montogomery Village, MD (US); Varada Rajan Komanduri, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 365 days.

This patent is subject to a terminal disclaimer.

(21) Appl. No.: 17/657,340

(22) Filed: Mar. 30, 2022

(65) Prior Publication Data

US 2022/0321239 A1    Oct. 6, 2022

Related U.S. Application Data

(60) Provisional application No. 63/266,262, filed on Dec. 30, 2021, provisional application No. 63/169,770, filed on Apr. 1, 2021.

(51) Int. Cl.
*H04B 15/00* (2006.01)
*H01Q 1/02* (2006.01)
(Continued)

(52) U.S. Cl.
CPC ............... *H01Q 1/02* (2013.01); *H01Q 1/24* (2013.01); *H01Q 1/42* (2013.01); *H01Q 3/36* (2013.01);
(Continued)

(58) Field of Classification Search
CPC .. H01Q 1/02; H01Q 1/24; H01Q 1/42; H01Q 1/526; H01Q 15/12; H01Q 21/06;
(Continued)

(56) References Cited

U.S. PATENT DOCUMENTS 7,671,696 B1    3/2010    Puzella et al.
10,319,700 B1    6/2019    Burton
(Continued)

FOREIGN PATENT DOCUMENTS

EP    3188229 A1    7/2017
WO    2010116357 A1    10/2010

OTHER PUBLICATIONS

International search report for PCT application No. PCT/US2022/071452.
(Continued)

*Primary Examiner* — Tan H Trinh
(74) *Attorney, Agent, or Firm* — Capitol City TechLaw; Jasbir Singh

(57) ABSTRACT

An AESA (Active Electronically Scanned Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; and a TIM (Thermal Interface Material), having a TIM height, disposed between a respective contact surface of the thermal pedestals and the obverse surface. The thermal pedestals are discrete with respect to one another, the contact surfaces of the thermal pedestals are interspersed about the TRMs, the thermal pedestals do not contact the TRMs, the TIM is electrically and thermally conductive, and the wall height plus the TIM height is sufficient to suppress resonances of the TRMs below a frequency greater than the Tx and Rx frequency bands of the TRMs.

17 Claims, 2 Drawing Sheets

(51) Int. Cl.
  *H01Q 1/24* (2006.01)
  *H01Q 1/42* (2006.01)
  *H01Q 3/36* (2006.01)
  *H05K 1/02* (2006.01)

(52) U.S. Cl.
  CPC ........... *H04B 15/00* (2013.01); *H05K 1/0203* (2013.01); *H05K 2201/10098* (2013.01)

(58) Field of Classification Search
  CPC ........ H01Q 3/36; H04B 15/00; H05K 1/0203; H05K 1/0209; H05K 1/023; H05K 1/0243; H05K 2201/066; H05K 2201/10098; H05K 2201/10371; H05K 2201/10969
  USPC ........................................................ 455/63.1
  See application file for complete search history.

(56) References Cited

U.S. PATENT DOCUMENTS

| | | | |
|---|---|---|---|
| 2004/0020634 A1* | 2/2004 | Boudreaux | H01L 21/4882 |
| | | | 29/890.032 |
| 2004/0212964 A1 | 10/2004 | Belady et al. | |
| 2010/0157531 A1 | 6/2010 | Mason et al. | |
| 2011/0075377 A1 | 3/2011 | Paquette et al. | |
| 2012/0063094 A1* | 3/2012 | Gaynes | H05K 3/30 |
| | | | 29/831 |
| 2014/0299980 A1* | 10/2014 | Choi | H01L 23/481 |
| | | | 257/698 |
| 2017/0099726 A1* | 4/2017 | Elliott | H05K 1/142 |
| 2017/0229368 A1 | 8/2017 | Chiu et al. | |
| 2017/0250120 A1* | 8/2017 | Harauchi | H01L 25/072 |
| 2017/0346185 A1 | 11/2017 | Wang et al. | |
| 2018/0090467 A1* | 3/2018 | Kim | H01L 25/18 |
| 2018/0316096 A1* | 11/2018 | Harauchi | H01Q 21/061 |
| 2019/0109101 A1 | 4/2019 | Menon et al. | |
| 2019/0319338 A1* | 10/2019 | Gu | H01L 22/32 |
| 2020/0359506 A1* | 11/2020 | Bedinger | H05K 3/303 |
| 2021/0013178 A1* | 1/2021 | Nakanishi | H01Q 21/0025 |
| 2022/0320705 A1* | 10/2022 | Buckley | H01Q 3/36 |
| 2023/0051507 A1* | 2/2023 | Gao | H01L 23/42 |

OTHER PUBLICATIONS

U.S. Appl. No. 63/169,770, filed Apr. 1, 2021, Michael Buckley.
International Search Report for PCT Application No. PCT/US2022/071453.

* cited by examiner

CAVITY RESONANCE SUPPRESSION USING DISCRETE THERMAL PEDESTALS IN ACTIVE ELECTRONICALLY SCANNED ARRAY

CROSS-REFERENCE TO RELATED APPLICATIONS AND INCORPORATION BY REFERENCE

The present application claims the benefit under 35 U.S.C. 119(e) of U.S. Provisional Application Ser. No. 63/169,770, filed Apr. 1, 2021, and U.S. Provisional Application Ser. No. 63/266,262, filed Dec. 30, 2021, all of which are incorporated herein by reference in their entireties.

FIELD

A low-cost easy to manufacture solution to address thermal, EMI (Electro-Magnetic Interference), volume and location requirements for an AESA (Active Electronically Scanned Array) is presented. The AESA includes passive thermal pedestals interspersed in an arrangement with the AESA active devices. The thermal pedestals are electrically and thermally conductive. The AESA may be used in satellite communications and radar systems.

BACKGROUND

The prior art uses a combination of thermal pedestals, EMI gasketing material, and EMI ground tape to address the thermal, EMI, and AESA active device placement requirements. The manufacture of the prior art is relatively more expensive and has relatively more fabrication complexity. Moreover, the reliability of the EMI ground tape is questionable.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

The present teachings provide a low-cost easy to manufacture solution to address thermal, EMI (Electro-Magnetic Interference), volume and location requirements for an AESA (Active Electronically Scanned Array). The AESA thermal pedestals meet the EMI performance requirements by suppressing cavity resonances of the AESA below a frequency greater than the Rx and Tx frequency bands of the AESA. For example, if the upper limit of the RX and TX frequency bands is 14.5 GHz, resonances below 15.5, 16.5, 17.5 or the like GHz are suppressed. The present teachings are applicable to RF (Radio Frequency) communication systems, for example, RF communications via LEO (Low Earth Orbit), MEO (Medium Earth Orbit) or GEO (Geosynchronous Earth Orbit) satellites and radar systems.

An AESA (Active Electronically Scanned Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; and a TIM (Thermal Interface Material), having a TIM height, disposed between a respective contact surface of the thermal pedestals and the obverse surface. The thermal pedestals are discrete with respect to one another, the contact surfaces of the thermal pedestals are interspersed about the TRMs via the TIM, the thermal pedestals do not contact the TRMs, the TIM is electrically and thermally conductive, and the wall height plus the TIM height is sufficient to suppress resonances of the TRMs below a frequency greater than the Tx and Rx frequency bands of the TRMs.

The AESA may include a heat sink, wherein the thermal pedestals extend from the heat sink.

The AESA may include fins extending from a first surface of the heat sink, wherein the thermal pedestals extend from a second surface of the heat sink different than the first surface of the heat.

The AESA where the heat sink, the fins and the thermal pedestals are of a unitary, one-piece construction.

The AESA where the heat sink is connected to a ground.

The AESA where the thermal pedestals are organized with substantial bilateral symmetry along both a first axis and a second axis orthogonal to the first axis.

The AESA where the TRMs are disposed in a non-equilateral triangular lattice, an equilateral triangular lattice, a rectangular lattice, or an aperiodic lattice.

The AESA may include antenna elements and a radome layer disposed over a reverse surface of the PCB.

The AESA may include a polarizer integrated with the radome.

The AESA where the thermal pedestals, the TIM and the PCB together form a stack having a cross-section depth less than or equal to 100 mils (2.54 millimeter).

The AESA where the thermal pedestals are shaped as a cross.

The AESA where the AESA is configured to operate in Ku and X frequency bands.

The AESA where an upper limit of the Tx and Rx frequency bands is less than or equal to 14.5 GHz and resonances frequencies are suppressed below 16 GHz.

The AESA is configured to operate with a scan angle $\theta$ from 0° to 45° and a $\varphi$ scan angle from 0° and 360°.

The AESA where an upper limit of the Tx and Rx frequency bands is less than or equal to 14.5 GHz with a scan angle $\theta$ from 0° to 45° and a $\varphi$ scan angle from $0° \leq \varphi \leq 360°$.

An AESA (Active Electronic Scanned Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; a TIM (Thermal Interface Material), having a TIM height, disposed between a respective contact surface of the thermal pedestals and the obverse surface; and a heat sink including fins. In the AESA, the thermal pedestals are discrete with respect to one another, the contact surfaces of the thermal pedestals are interspersed about the TRM, the thermal pedestals do not contact the TRMs, the TIM is electrically and thermally conductive, the wall height plus the TIM height is sufficient to suppress resonances of the TRMs below a frequency greater than the Tx and Rx frequency bands used by the TRMs, the fins extend from a first surface of the heat sink and the thermal pedestals extend from a second surface of the heat sink different than the first surface of the heat, the heat sink, the fins and the thermal pedestals are of a unitary, one-piece construction, and an upper limit of Tx and Rx frequency bands of the TRMs is less than or equal to 14.5 GHz with a scan angle $\theta$ from 0° to 45° and a $\varphi$ scan angle from $0° \leq \varphi \leq 360°$.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

Figure 1A:
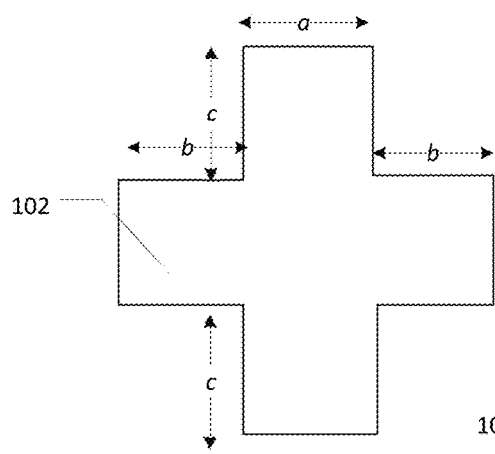
FIG. 1A illustrates a top view of an exemplary thermal pedestals encircling the transmit receive active devices of the AESA according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Embodiments are discussed in detail below. While specific implementations are discussed, this is done for illustration purposes only. A person skilled in the relevant art will recognize that other components and configurations may be used without parting from the spirit and scope of the subject matter of this disclosure.

The terminology used herein is for describing embodiments only and is not intended to be limiting of the present disclosure. As used herein, the singular forms "a," "an" and "the" are intended to include the plural forms as well, unless the context clearly indicates otherwise. Furthermore, the use of the terms "a," "an," etc. does not denote a limitation of quantity but rather denotes the presence of at least one of the referenced items. The use of the terms "first," "second," and the like does not imply any order, but they are included to either identify individual elements or to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

A low-cost solution to address thermal, electromagnetic interference (EMI), and AESA active device volume and location requirements is disclosed. Thermal pedestals are a passive means to remove heat generated by active devices of the AESA. The active devices may include an TRM or the like.

Thermal pedestals conduct the heat from the surface of a printed circuit board to a metal surface enclosing an AESA cavity. The thermal pedestals may serve as electromagnetic grounding vias. The EMI requirements may be addressed by placing the thermal pedestals in an arrangement throughout the AESA cavity. The density of the thermals suppresses in-band resonances in the AESA cavity and removes heat. The resonance and heat removal allow for safe operation of the AESA. The arrangement of the thermal pedestals leaves adequate room to place the AESA active device. In some embodiments, the AESA active devices may be placed per a Triangular shape AESA geometrical arrangement.

The present teachings provide a very low-cost approach that is easy to fabricate into the AESA. An AESA's in band cavity resonance may be suppressed without sacrificing the system performance. The AESA may be used in RF communication systems including LEO and MEO satellite systems, and GEO satellite systems with mobile or small form factor user terminals and in radar systems.

FIG. 1A illustrates a top view of an exemplary thermal pedestal according to various embodiments.

A thermal pedestal 102 may be shaped as a cross, a plus sign, an X or the like. The thermal pedestal 102 may have a first wall length a, a second wall length b and a third wall length c. In exemplary embodiments, the first wall length a, second wall length b and third wall length c may have a length ranging from 1 (millimeters) to 20 mm, for example, 2 mm.

Figure 1B:
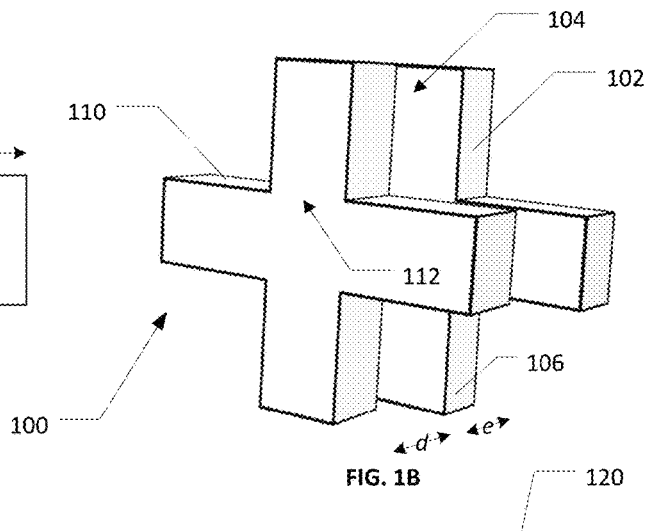
FIG. 1B illustrates a perspective view of an exemplary thermal pedestal arrangement according to various embodiments.

FIG. 1B illustrates a perspective view of an exemplary thermal pedestal arrangement according to various embodiments.

A thermal pedestal arrangement 100 may include the thermal pedestal 102 and a TIM 110. The thermal pedestal 102 may include a contact surface 104 to affix the thermal pedestal 102 with the TIM 110. The TIM 110 may include a PCB contact surface 112 to affix the TIM 110 to a PCB (not shown; see FIG. 1C). The thermal pedestal 102 may have a wall 106 having a wall height e. In exemplary embodiments, the wall height c may be from 1 mm to 20 mm, for example, 2 mm. The TIM 110 may have a wall height d. In exemplary embodiments, the wall height d may be from 5 mils to 100 mils (a mil is a unit of length equal to 0.001 inches or 0.0254 mm), for example, 5, 10, 11, 12, 13, 14, 15, 16, 17, 18 or 20 mils.

Figure 1C:
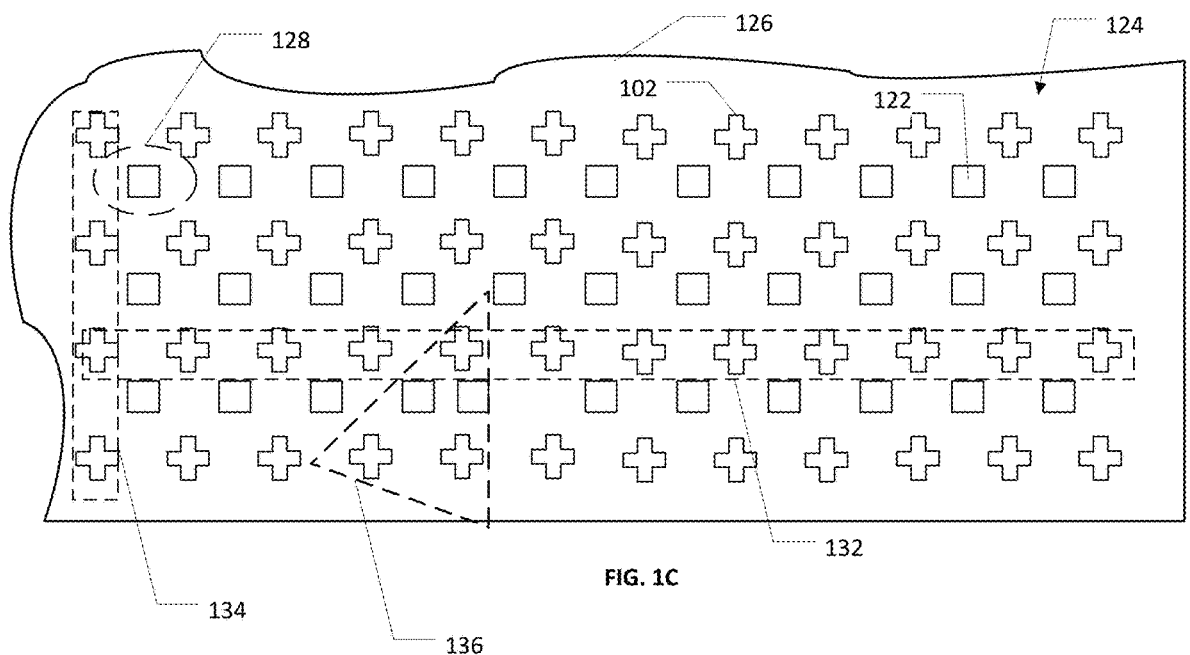
FIG. 1C illustrates a top view of a surface of a PCB included in an AESA according to various embodiments.

FIG. 1C illustrates a top view of a surface of a PCB included in an AESA according to various embodiments.

An AESA 120 may include a PCB 126 including a surface 124. An arrangement of thermal pedestals 102 may be interspersed with TRMs 122. The TIM 110 (not visible in FIG. 1C) may be disposed between the thermal pedestals 102 and the surface 124 of the PCB 126. The thermal pedestals 102 may be arranged to encircle in a ring 128 one of the TRMs 122. The ring 128 may be virtual. The ring 128 may be non-contiguous. In some embodiments, the TRMs 122 may be a microchip. The TRMs 122 may be electrically connected to the PCB 126. The PCB 126 may include an exposed ground wire (not shown). Portions of the exposed ground wire of the PCB 126 may be electrically connected to the TRMs 122. Portions of the exposed ground wire of the PCB 126 may correspond to each of the TIMs 110 which are electrically connected thereto. The thermal pedestals 102 may be electrically connected to the exposed ground wire of the PCB 126 via the TIM 110. The thermal pedestals 102 may be thermally connected to the TRMs 122 via the PCB 126 and TIM 110. In order to be a discrete thermal pedestal, a first one of the thermal pedestals 102 may not share a fragment of its defining wall 106 (see FIG. 1B) with a fragment of the wall 106 defining a second one of the thermal pedestals 102.

Some of the thermal pedestals 102 may be arranged in a row 132. Some of the thermal pedestals may be arranged in a column 134. The row 132 may be orthogonal to the column 134. The row 132 may be non-orthogonal to the column 134 to form a triangular grid 136 for with the thermal pedestals and the TRMs. The triangular grid may form a non-equilateral triangle.

Figure 2:
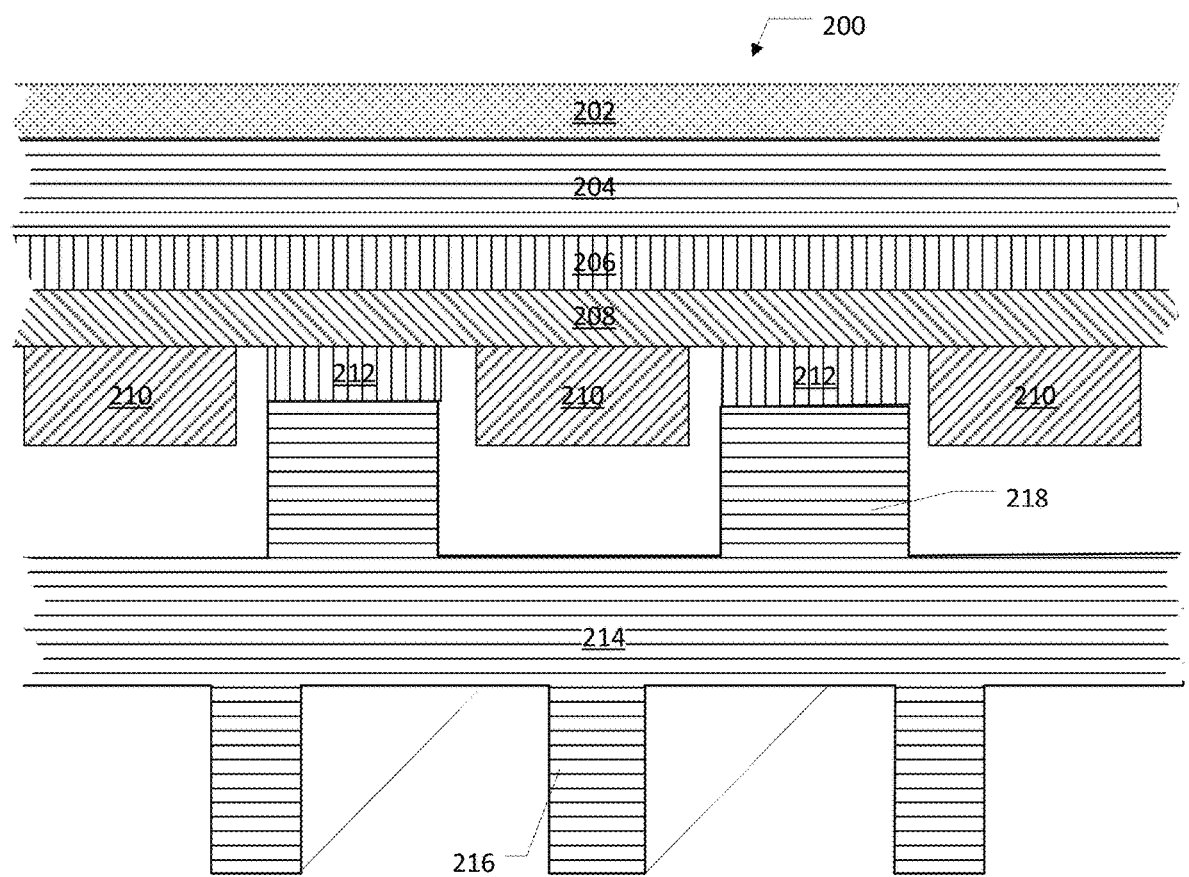
FIG. 2 illustrates a cross-sectional view of an AESA according to various embodiments.

FIG. 2 illustrates a cross-sectional view of an AESA according to various embodiments.

An AESA 200 may include a plurality of layers including a radome 202, a polarizer 204, an air gap 206, a PCB 208, and a heat sink 214. TRMs 210 may be disposed on the PCB 208. A TIM 212 may contact the PCB 208 and thermal pedestals 218. Thermal pedestals 218 may extend from a heat sink 214. Fins 216 may extend from the heat sink 214. Heat from the TRMs 210 may be exchanged (convectively) with an ambient environment via the heat sink 214. In some embodiments, the heat may be conducted from the TRMs 210 to the TIM 212 to the thermal pedestals 218 to the heat sink 212 to the fins 216. The heat sink 214 may be a heat sink.

Metal manufacturing processes such as casting (expendable or permanent mold casting), powder metallurgy, deformation, material removal, nontraditional (lasers, electron beams, chemical erosion, electric discharge and electrochemical energy), or joining and assembly may be used to form the thermal pedestals along with the heat sink and fins as desired.

Although the subject matter has been described in language specific to structural features and/or methodological acts, it is to be understood that the subject matter in the appended claims is not necessarily limited to the specific features or acts described above. Rather, the specific features and acts described above are disclosed as example forms of implementing the claims. Other configurations of the described embodiments are part of the scope of this disclosure. Further, implementations consistent with the subject matter of this disclosure may have more or fewer acts than as described or may implement acts in a different order than as shown. Accordingly, the appended claims and their legal equivalents should only define the invention, rather than any specific examples given.

We claim as our invention:

1. An AESA (Active Electronically Scanned Array) comprising:
    a PCB (Printed Circuit Board) substrate having an obverse surface;
    TRMs (Transmit/Receive Modules) disposed on the obverse surface;
    thermal pedestals wherein each thermal pedestal comprises a wall, having a wall height, comprising wall surfaces and one of the wall surfaces being a contact surface; and
    a TIM (Thermal Interface Material), having a TIM height, disposed between a respective contact surface of the thermal pedestals and the obverse surface,
    wherein the thermal pedestals are discrete with respect to one another,
    the contact surfaces of the thermal pedestals are interspersed about the TRMs,
    the thermal pedestals do not contact the TRMs,
    the TIM is electrically and thermally conductive, and
    the wall height plus the TIM height is sufficient to suppress resonances of the TRMs below a frequency greater than Tx and Rx frequency bands of the TRMs.

2. The AESA of claim 1, further comprising a heat sink, wherein the thermal pedestals extend from the heat sink.

3. The AESA of claim 2, further comprising fins extending from a first surface of the heat sink, wherein the thermal pedestals extend from a second surface of the heat sink different than the first surface of the heat sink.

4. The AESA of claim 3, wherein the heat sink, the fins and the thermal pedestals are of a unitary, one-piece construction.

5. The AESA of claim 2, wherein the heat sink is connected to a ground.

6. The AESA of claim 1, wherein the thermal pedestals are organized with substantial bilateral symmetry along both a first axis and a second axis orthogonal to the first axis.

7. The AESA of claim 1, wherein the TRMs are disposed in a non-equilateral triangular lattice.

8. The AESA of claim 1, further comprising antenna elements and a radome layer disposed over a reverse surface of the PCB.

9. The AESA of claim 8, further comprising a polarizer layer disposed between the radome layer.

10. The AESA of claim 1, wherein the thermal pedestals, the TIM and the PCB together form a stack having a cross-section depth less than or equal to 100 mils (2.54 millimeter).

11. The AESA of claim 1, wherein the thermal pedestals are shaped as a cross.

12. The AESA of claim 1, wherein the thermal pedestals are interspersed without contacting, the TRMs.

13. The AESA of claim 1, wherein the AESA is configured to operate in Ku and X frequency bands.

14. The AESA of claim 1, wherein an upper limit of the Tx and Rx frequency bands is less than or equal to 14.5 GHz and resonance frequencies are suppressed below 16 GHz.

15. The AESA of claim 1, wherein the AESA is configured to operate with a scan angle $\theta$ from 0° to 45° and a $\varphi$ scan angle from 0° and 360°.

16. The AESA of claim 1, wherein an upper limit of the Tx and Rx frequency bands is less than or equal to 14.5 GHz with a scan angle $\theta$ from 0° to 45° and a $\varphi$ scan angle from $0° \leq \varphi \leq 360°$.

17. An AESA (Active Electronically Scanned Array), comprising:
    a PCB (Printed Circuit Board) substrate having an obverse surface;
    TRMs (Transmit/Receive Modules) disposed on the obverse surface;
    thermal pedestals wherein each thermal pedestal comprises a wall, having a wall height, comprising wall surfaces and one of the wall surfaces being a contact surface;
    a TIM (Thermal Interface Material), having a TIM height, disposed between a respective contact surface of the thermal pedestals and the obverse surface; and
    a heat sink comprising fins,
    wherein the thermal pedestals are discrete with respect to one another, the contact surfaces of the thermal pedestals are interspersed about the TRMs,
the thermal pedestals do not contact the TRMs,
the TIM is electrically and thermally conductive,
the wall height plus the TIM height is sufficient to suppress resonances of the TRMs below a frequency greater than Tx and Rx frequency bands of the TRMs,
the fins extend from a first surface of the heat sink and the thermal pedestals extend from a second surface of the heat sink different than the first surface of the heat sink,
the heat sink, the fins and the thermal pedestals are of a unitary, one-piece construction, and
an upper limit of the Tx and Rx frequency bands of the TRMs is less than or equal to 14.5 GHz with a scan angle $\theta$ from 0° to 45° and a $\varphi$ scan angle from $0° \leq \varphi \leq 360°$.

* * * * *